(12) United States Patent
We et al.

(10) Patent No.: US 11,302,656 B2
(45) Date of Patent: Apr. 12, 2022

(54) PASSIVE DEVICE ORIENTATION IN CORE FOR IMPROVED POWER DELIVERY IN PACKAGE

(71) Applicant: QUALCOMM Incorporated, San Diego, CA (US)

(72) Inventors: Hong Bok We, San Diego, CA (US); Aniket Patil, San Diego, CA (US); Joan Rey Villarba Buot, Escondido, CA (US); Zhijie Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 3 days.

(21) Appl. No.: 16/938,316

(22) Filed: Jul. 24, 2020

(65) Prior Publication Data
US 2022/0028805 A1    Jan. 27, 2022

(51) Int. Cl.
| | |
|---|---|
| *H01L 23/64* | (2006.01) |
| *H01L 21/48* | (2006.01) |
| *H01L 23/498* | (2006.01) |
| *H01L 23/00* | (2006.01) |
| *H01L 25/065* | (2006.01) |

(52) U.S. Cl.
CPC .......... *H01L 23/642* (2013.01); *H01L 21/486* (2013.01); *H01L 21/4853* (2013.01); *H01L 21/4857* (2013.01); *H01L 23/49822* (2013.01); *H01L 23/49827* (2013.01); *H01L 23/49833* (2013.01); *H01L 23/49838* (2013.01); *H01L 24/16* (2013.01); *H01L 25/0657* (2013.01); *H01L 2224/16227* (2013.01); *H01L 2225/06513* (2013.01); *H01L 2225/06541* (2013.01); *H01L 2225/06555* (2013.01); *H01L 2225/06586* (2013.01); *H01L 2924/1431* (2013.01); *H01L 2924/19041* (2013.01); *H01L 2924/19103* (2013.01)

(58) Field of Classification Search
CPC ......... H01L 23/49833; H01L 23/49838; H01L 23/49822; H01L 23/642; H01L 21/4853; H01L 21/4857; H01L 21/486
See application file for complete search history.

(56) References Cited

U.S. PATENT DOCUMENTS

9,553,079 B1 *   1/2017   Audet ............... H01L 23/49816
2004/0027813 A1 * 2/2004   Li ..................... H01L 23/49822
                                                                    361/767
(Continued)

*Primary Examiner* — Michael Jung
(74) *Attorney, Agent, or Firm* — Seyfarth Shaw LLP (57) ABSTRACT

An integrated circuit (IC) package is described. The IC package includes a package substrate, composed of a substrate core, a first power rail on a first surface of the substrate core, and a second power rail on a second surface of the substrate core. The IC package includes a logic die supported by the second power rail on the second surface of the substrate core. The IC package includes passive devices within the substrate core. Each of the passive devices has a first terminal and a second terminal opposite the first terminal. The first terminal of each of the passive devices is directly coupled to the first power rail, and the second terminal of each of the plurality of passive devices is directly coupled to the second power rail. The IC package includes package bumps on the second power rail on the second surface of the substrate core.

13 Claims, 10 Drawing Sheets

(56) References Cited

U.S. PATENT DOCUMENTS

| | | | | |
|---|---|---|---|---|
| 2012/0080222 A1* | 4/2012 | Kim | ................... | H05K 1/0231 |
| | | | | 174/260 |
| 2014/0029222 A1* | 1/2014 | Saito | ................. | H01L 23/3121 |
| | | | | 361/762 |
| 2014/0182896 A1* | 7/2014 | Lee | ...................... | H05K 1/185 |
| | | | | 174/251 |
| 2019/0006356 A1* | 1/2019 | Lim | ................... | H01L 23/5223 |
| 2019/0393297 A1* | 12/2019 | Kung | ................ | H01L 21/4857 |

* cited by examiner

PASSIVE DEVICE ORIENTATION IN CORE FOR IMPROVED POWER DELIVERY IN PACKAGE

BACKGROUND

Field

Aspects of the present disclosure relate to integrated circuits (ICs) and, more particularly, to a passive device orientation in a package substrate core for improved power delivery in an IC package.

Background

Electrical connections exist at each level of a system hierarchy. This system hierarchy includes interconnection of active devices at a lowest system level all the way up to system level interconnections at the highest level. For example, interconnect layers can connect different devices together on an IC. As ICs become more complex, more interconnect layers are used to provide the electrical connections between the devices. More recently, the number of interconnect levels for circuitry has substantially increased due to the large number of devices that are now interconnected in a modern electronic device. The increased number of interconnect levels for supporting the increased number of devices involves more intricate processes.

State-of-the-art mobile application devices demand a small form factor, low cost, a tight power budget, and high electrical performance. Mobile package design has evolved to meet these divergent goals for enabling mobile applications that support multimedia enhancements. Current semiconductor (e.g., silicon (Si)) node shrinkage results in increased power density for modern dies. That is, implementation of increased power delivery specifications is limited to a smaller die region due to the small form factor. These increased power delivery specifications also demand an increased quantity of decoupling capacitors. The ability to provide increased component quantity, however, is limited due to component size dimensions.

SUMMARY

An integrated circuit (IC) package is described. The IC package includes a package substrate, composed of a substrate core, a first power rail on a first surface of the substrate core, and a second power rail on a second surface of the substrate core. The IC package includes a logic die supported by the second power rail on the second surface of the substrate core. The IC package includes passive devices within the substrate core. Each of the passive devices has a first terminal and a second terminal opposite the first terminal. The first terminal of each of the passive devices is directly coupled to the first power rail, and the second terminal of each of the plurality of the passive devices is directly coupled to the second power rail. The IC package includes package bumps on the second power rail on the second surface of the substrate core.

A method for fabricating an integrated circuit (IC) package is described. The method includes aligning a placement part with openings through a substrate core according to a pattern of passive devices. The method also includes feeding the passive devices into openings in the placement part and into the openings of the substrate core through a component standing unit. The method further includes forming a first power rail on a first surface of the substrate core, and a second power rail on a second surface of the substrate core. The method also includes coupling a first terminal of each of the passive devices to the first power rail, and a second terminal of each of the passive devices to the second power rail.

An integrated circuit (IC) package is described. The IC package includes a package substrate, composed of a substrate core, first means for supplying power on a first surface of the substrate core, and second means for supplying power on a second surface of the substrate core. The IC package includes a logic die supported by the second power supplying means on the second surface of the substrate core. The IC package includes passive devices within the substrate core. Each of the passive devices has a first terminal and a second terminal opposite the first terminal. The first terminal of each of the passive devices is directly coupled to the first power supplying means, and the second terminal of each of the passive devices is directly coupled to the second power supplying means. The IC package includes package bumps on the second power supplying means on the second surface of the substrate core.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described, the use of the term "and/or" is intended to represent an "inclusive OR," and the use of the term "or" is intended to represent an "exclusive OR." As described, the term "exemplary" used throughout this description means "serving as an example, instance, or illustration," and should not necessarily be construed as preferred or advantageous over other exemplary configurations. As described, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described, the term "proximate" used throughout this description means "adjacent, very near, next to, or close to." As described, the term "on" used throughout this description means "directly on" in some configurations, and "indirectly on" in other configurations.

A system hierarchy includes interconnection of active devices at a lowest system level all the way up to system level interconnections at a highest level. In particular, electrical connections exist at each of the levels of the system hierarchy to connect different devices together on an integrated circuit (IC). As ICs become more complex, however, more interconnect layers are used to provide the electrical connections between the devices. More recently, the number of interconnect levels for circuitry has substantially increased due to the large number of devices that are now interconnected in a state-of-the-art mobile application device.

State-of-the-art mobile application devices demand a small form factor, low cost, a tight power budget, and high electrical performance. Mobile package design has evolved to meet these divergent goals for enabling mobile applications that support multimedia enhancements involving high electrical performance, while complying with a tight power budget. An embedded passive substrate (EPS) provides a solution for improving power delivery in a die package. An embedded passive substrate enables decoupling capacitor efficiency by moving decoupling capacitors closer to power rails of a die package.

Current semiconductor (e.g., silicon (Si)) node shrinkage results in increased power density for modern dies. That is, implementation of increased power delivery specifications is limited to a smaller die region due to the smaller form factor of the die package. These increased power delivery specifications also demand an increased quantity of decoupling capacitors. The ability to provide an increased passive component quantity, however, is limited due to component size dimensions (e.g., x/y directions). The dimension size of passive components is generally larger because the passive components are placed horizontally inside the embedded passive substrate.

Various aspects of the present disclosure are directed to an integrated passive device orientation in core for an improved power delivery in a die package. The process flow for fabrication of the integrated passive device orientation may include embedded passive substrate process technology. It will be understood that the term "layer" includes film and is not construed as indicating a vertical or horizontal thickness unless otherwise stated. As described, the term "substrate" may refer to a substrate of a diced wafer or may refer to a substrate of a wafer that is not diced. As further described, the term "laminate" may refer to a multilayer sheet to enable packaging of an IC device, such as a die package. The terms "substrate," "wafer," and "laminate" may be used interchangeably. Similarly, the terms "chip," "chiplet," and "die" may be used interchangeably. In addition, the terms "passive device" and "passive component" may be used interchangeably.

Aspects of the present disclosure are directed to improving passive component density by placing the passive devices in an improved orientation. One aspect of the present disclosure is directed to a substrate structure and fabrication method that enables vertical placement of passive devices to increase component density in a die package. According to aspects of the present disclosure, vertical placement of passive components enables at least a two-fold increase of passive component density. In one configuration, the improved passive component placement may alternate between power and ground layers according to assignment strategy to improve power distribution within a die package.

Figure 1:
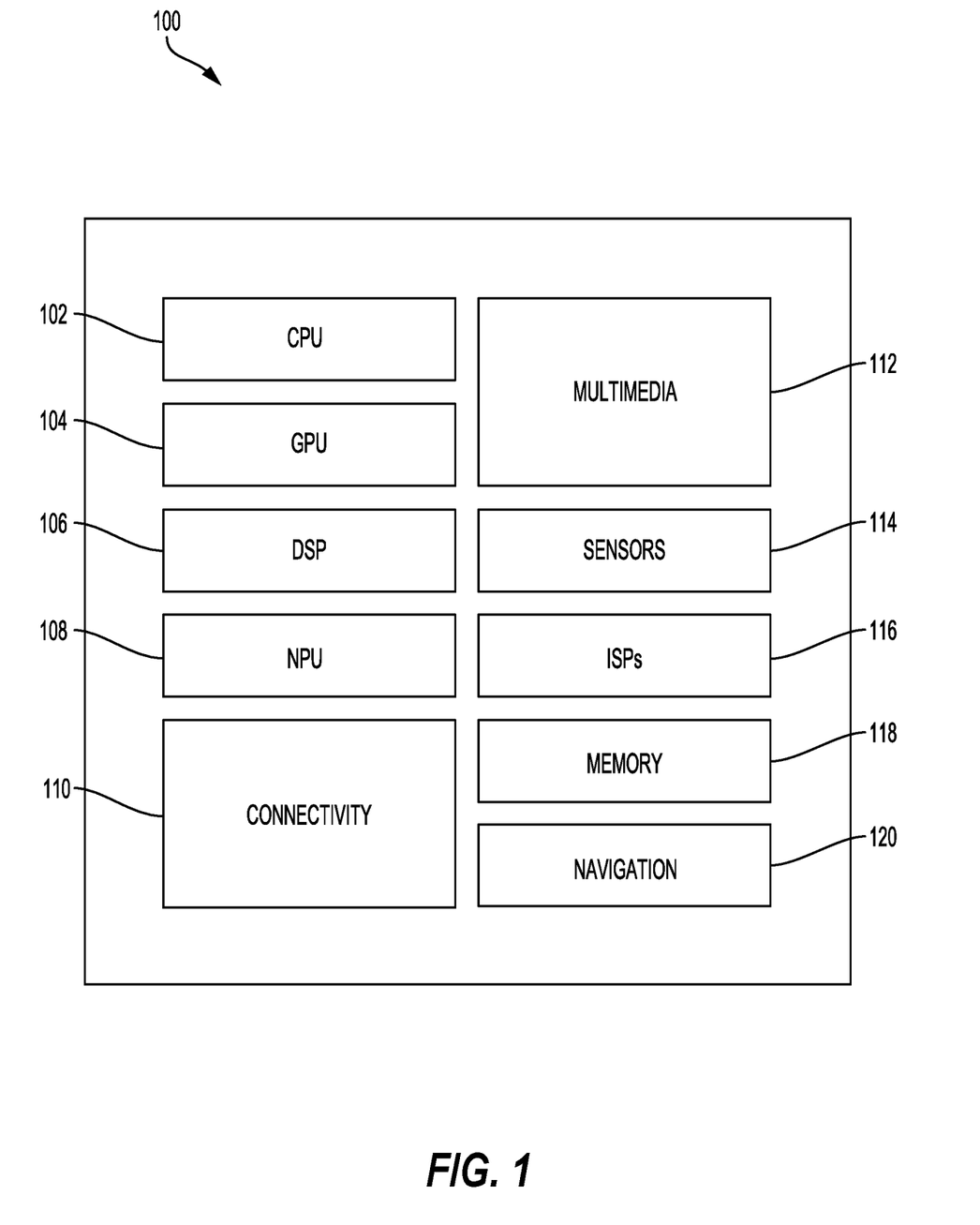
FIG. 1 is a block diagram illustrating an example implementation of a system-on-a-chip (SOC), including a passive device orientation in a core for improved power distribution in an integrated circuit (IC) package, in accordance with certain aspects of the present disclosure.

FIG. 1 is a block diagram illustrating an example implementation of a host system-on-a-chip (SOC) 100, which includes a passive device orientation in a substrate core for improved power distribution in package, in accordance with aspects of the present disclosure. The host SOC 100 includes processing blocks tailored to specific functions, such as a connectivity block 110. The connectivity block 110 may include fifth generation (5G) connectivity, fourth generation long term evolution (4G LTE) connectivity, Wi-Fi connectivity, USB connectivity, Bluetooth® connectivity, Secure Digital (SD) connectivity, and the like.

In this configuration, the host SOC 100 includes various processing units that support multi-threaded operation. For the configuration shown in FIG. 1, the host SOC 100 includes a multi-core central processing unit (CPU) 102, a graphics processor unit (GPU) 104, a digital signal processor (DSP) 106, and a neural processor unit (NPU) 108. The host SOC 100 may also include a sensor processor 114, image signal processors (ISPs) 116, a navigation module 120, which may include a global positioning system, and a memory 118. The multi-core CPU 102, the GPU 104, the DSP 106, the NPU 108, and the multi-media engine 112 support various functions such as video, audio, graphics, gaming, artificial networks, and the like. Each processor core of the multi-core CPU 102 may be a reduced instruction set computing (RISC) machine, an advanced RISC machine (ARM), a microprocessor, or some other type of processor. The NPU 108 may be based on an ARM instruction set.

Figure 2:
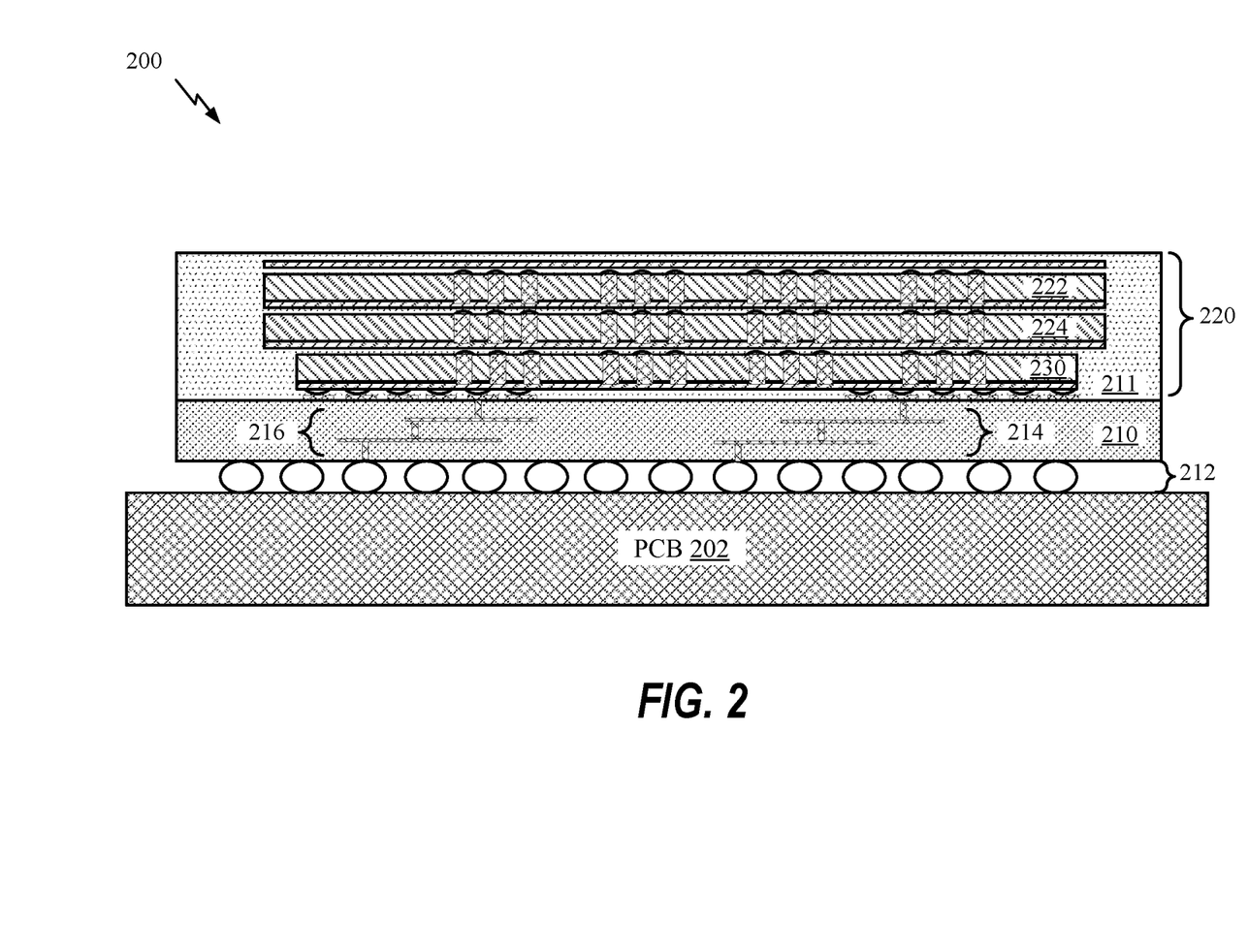
FIG. 2 is a block diagram showing a cross-sectional view of a stacked integrated circuit (IC) package, including the system-on-a-chip (SOC) of FIG. 1.

FIG. 2 is a block diagram showing a cross-sectional view illustrating a stacked IC package 200 of the SOC 100 of FIG. 1. Representatively, the stacked IC package 200 includes a printed circuit board (PCB) 202 connected to a package substrate 210 with interconnects 212. In this configuration, the package substrate 210 includes conductive layers 214 and 216. Above the package substrate 210 is a 3D chip stack 220, including stacked dies 222, 224, and 230, encapsulated by mold compound 211. In one aspect of the present disclosure, the die 230 is the SOC of FIG. 1.

Figure 3:
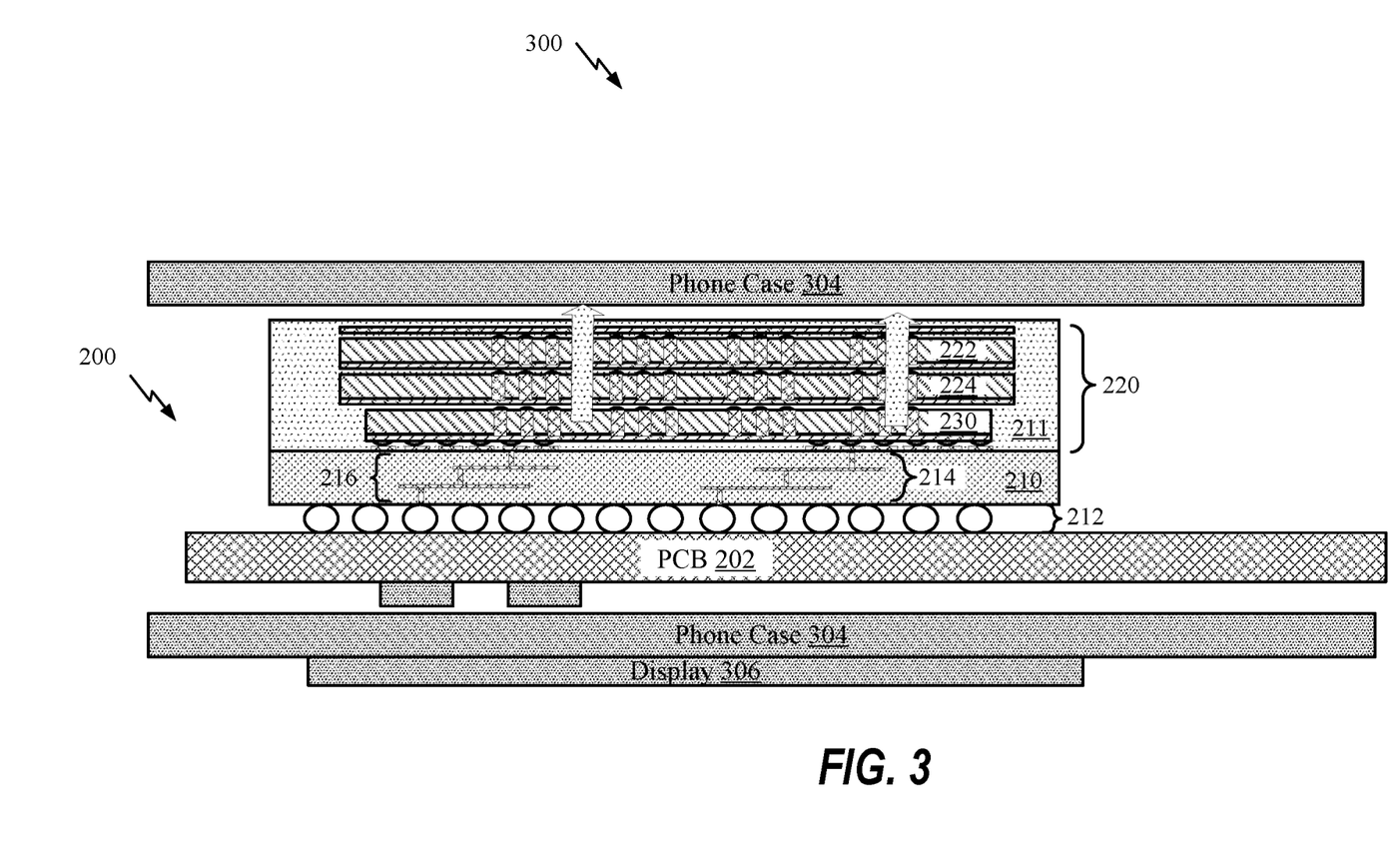
FIG. 3 is a block diagram showing a cross-sectional view illustrating the stacked integrated circuit (IC) package of FIG. 2, incorporated into a mobile device, according to one aspect of the present disclosure.

FIG. 3 is a block diagram showing a cross-sectional view illustrating the stacked IC package 200 of FIG. 2, incorporated into a wireless device 300, according to one aspect of the present disclosure. As described, the wireless device 300 may include, but is not limited to, a smartphone, tablet, handheld device, or other limited form factor device configured for 5G communications. Representatively, the stacked IC package 200 is within a phone case 304, including a display 306. In this configuration, a passive device orientation in a package substrate core for improved power distribution is integrated into the stacked IC package 200, for example, as shown in FIG. 4.

Figure 4:
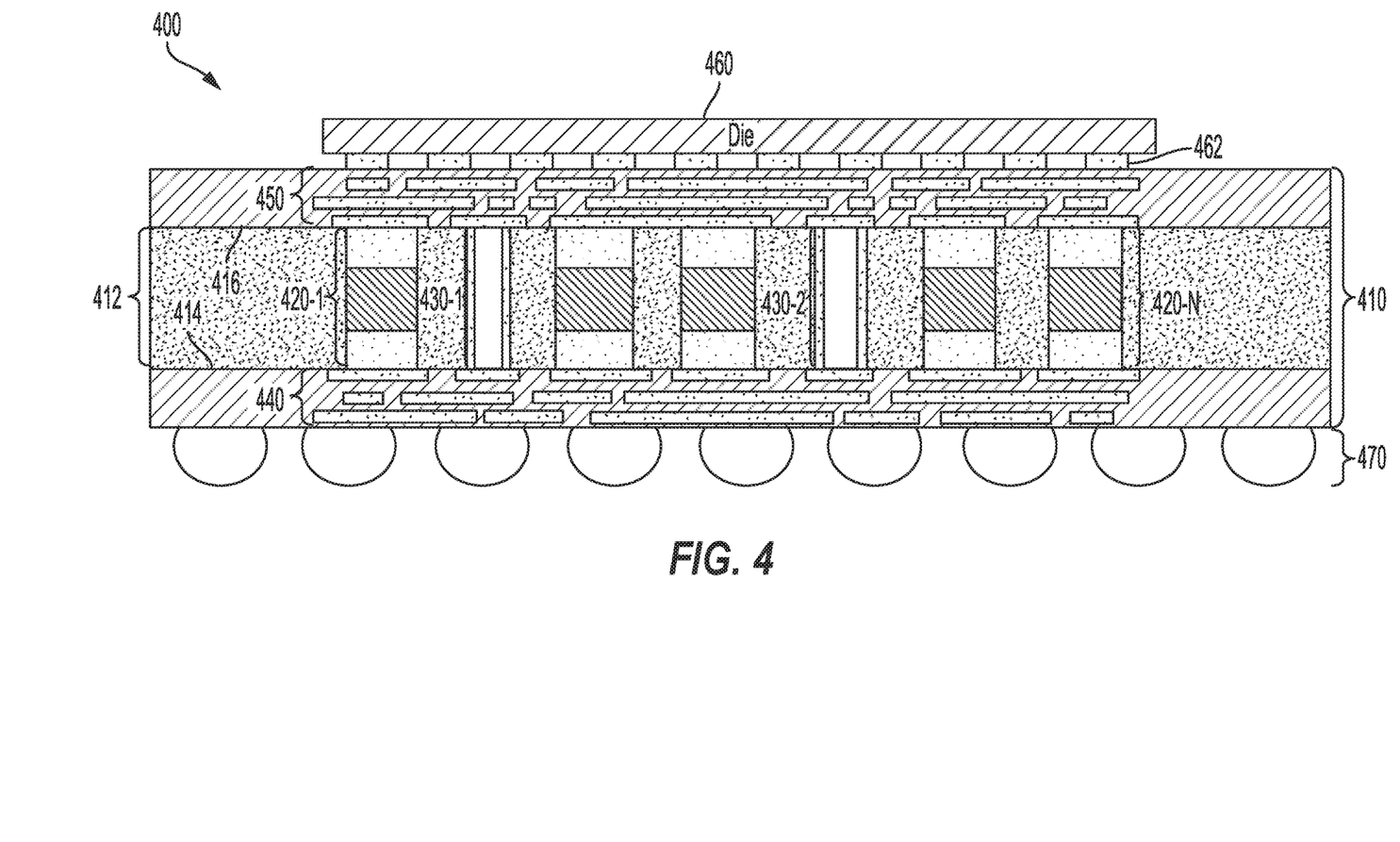
FIG. 4 is a block diagram illustrating an integrated circuit (IC) package, having a logic die, a substrate including a first power rail, a second power rail, and a substrate core, including passive devices in an improved orientation, according to aspects of the present disclosure.

FIG. 4 is a block diagram illustrating an integrated circuit (IC) package 400, having a logic die 460 supported by a package substrate 410 having a first power rail 440, a second power rail 450, and a substrate core 412, including passive devices 420 (420-1 . . . 420-N) in an improved orientation, according to aspects of the present disclosure. Aspects of the present disclosure are directed to improving passive component density by placing the passive devices 420 (420-1 . . . 420-N) in an improved orientation within a substrate core 412.

FIG. 4 illustrates the IC package 400 having the passive device orientation in the substrate core 412 for improved power delivery in the IC package 400, according to aspects of the present disclosure. In this aspect of the present disclosure, the passive devices 420 (420-1 . . . 420-N) are placed vertically within the substrate core 412 to increase passive component density available in the IC package 400. In this example, a vertical placement of the passive devices 420 (420-1 . . . 420-N) enables at least a two-fold density increase of the passive components within the IC package 400. In one configuration, the improved placement of the passive devices 420 (420-1 . . . 420-N) may alternate between power and ground layers of the first power rail 440 and the second power rail 450 of the package substrate 410. This placement of the passive devices 420 (420-1 . . . 420-N) may be performed according to an assignment strategy for improving power distribution within the IC package 400.

In one configuration, the package substrate 410 includes the substrate core 412, having a first surface 414 and a second surface 416. The substrate core 412 may be an embedded passive substrate (EPS), a laminate substrate, or other like substrate. In this configuration, the first power rail 440 is on the first surface 414, and the second power rail 450 is on the second surface 416 of the substrate core 412. In addition, package bumps 470 are coupled to the first power rail 440 of the package substrate 410 of the IC package 400. The substrate core 412 includes through substrate vias 430 (430-1 and 430-2) placed between the first power rail 440 and the second power rail 450. In this configuration, the logic die 460 is coupled to the second power rail 450 of the package substrate 410 through contact pads 462 opposite from the package bumps 470.

In this configuration, terminals of the passive devices 420 (420-1 . . . 420-N) are coupled between the first power rail 440 and the second power rail 450. This orientation of the passive devices 420 (420-1 . . . 420-N) improves power distribution within the IC package 400 by increasing the quantity of passive devices 420 (420 1 . . . 420-N), such as a decoupling capacitor, or other like passive components. According to aspects of the present disclosure, this placement of the passive devices 420 (420-1 . . . 420-N) enables at least a two-fold density increase of the passive components compared to conventional orientations, as shown in FIGS. 5 and 6.

Figure 5:
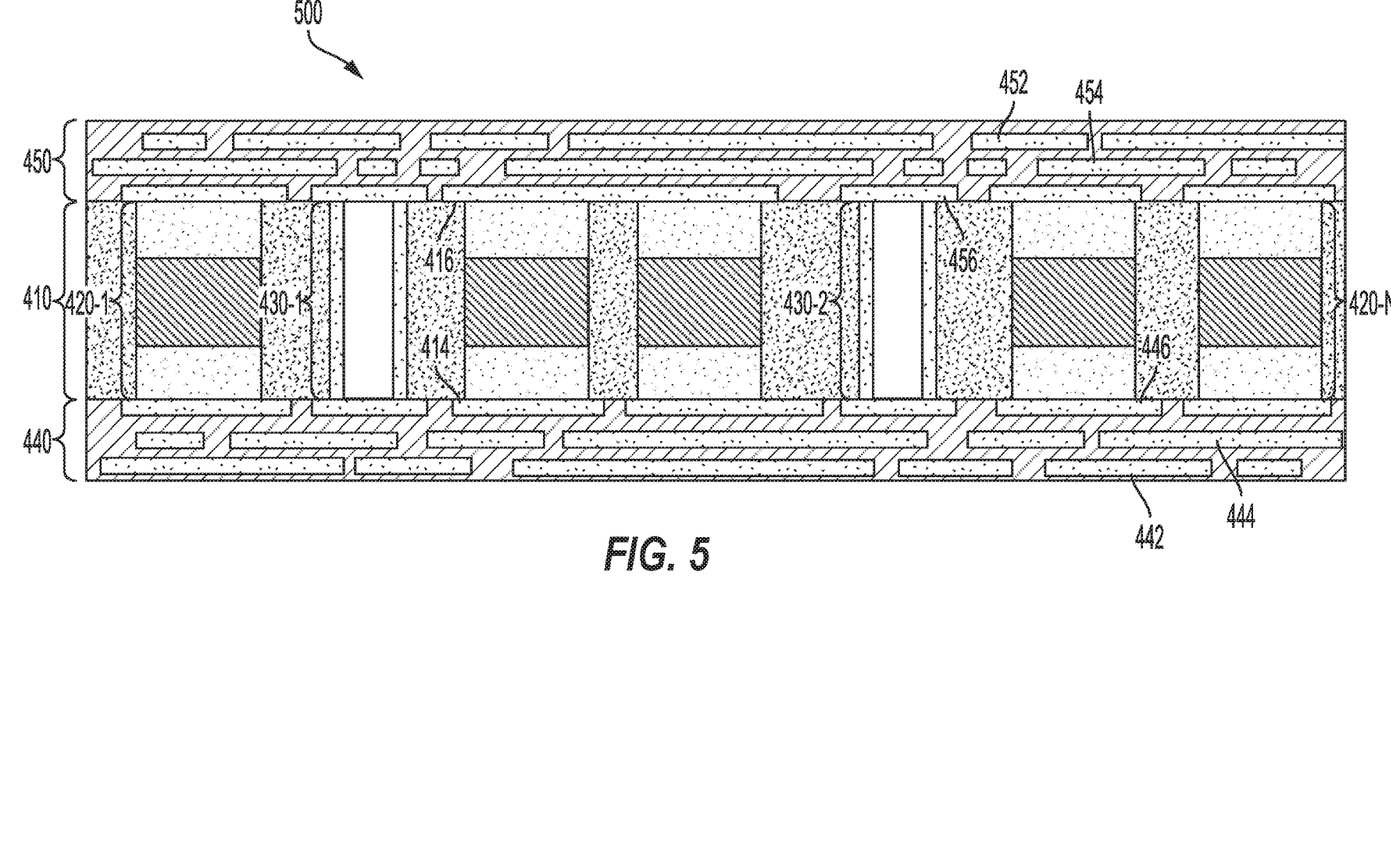
FIG. 5 is a block diagram further illustrating the package substrate of the integrated circuit (IC) package of FIG. 4, having the passive device orientation in the substrate core for improved passive component density within the IC package, according to aspects of the present disclosure

FIG. 5 is a block diagram 500 further illustrating the package substrate 410 of the IC package 400 of FIG. 4, having the passive device orientation in core for improved passive component density within the IC package 400, according to aspects of the present disclosure. In this aspect of the present disclosure, the improved placement of the passive devices 420 (420-1 . . . 420-N) may alternate between power and ground layers of the first power rail 440 and the second power rail 450. For example, placement of the passive devices 420 (420-1 . . . 420-N) is performed according to an assignment strategy for improving power distribution within the IC package 400. In this example, the passive devices 420 (420-1 . . . 420-N) are placed vertically relative to a width of the substrate core 412.

In this configuration, the first power rail 440 includes a first ground layer 442, a power layer 444, and a second ground layer 446, such that the first power rail 440 is a ground rail. In addition, the second power rail 450 includes a first power layer 452, a ground layer 454, and a second power layer 456, such that the second power rail 450 is a power rail. In another configuration, placement of the passive devices 420 (420-1 . . . 420-N) alternates between power and ground layers of the first power rail 440 and the second power rail 450. Alternating the power and ground layers may follow an assignment strategy to improve power distribution and passive component density within the IC package 400 for improved operation.

Figure 6:
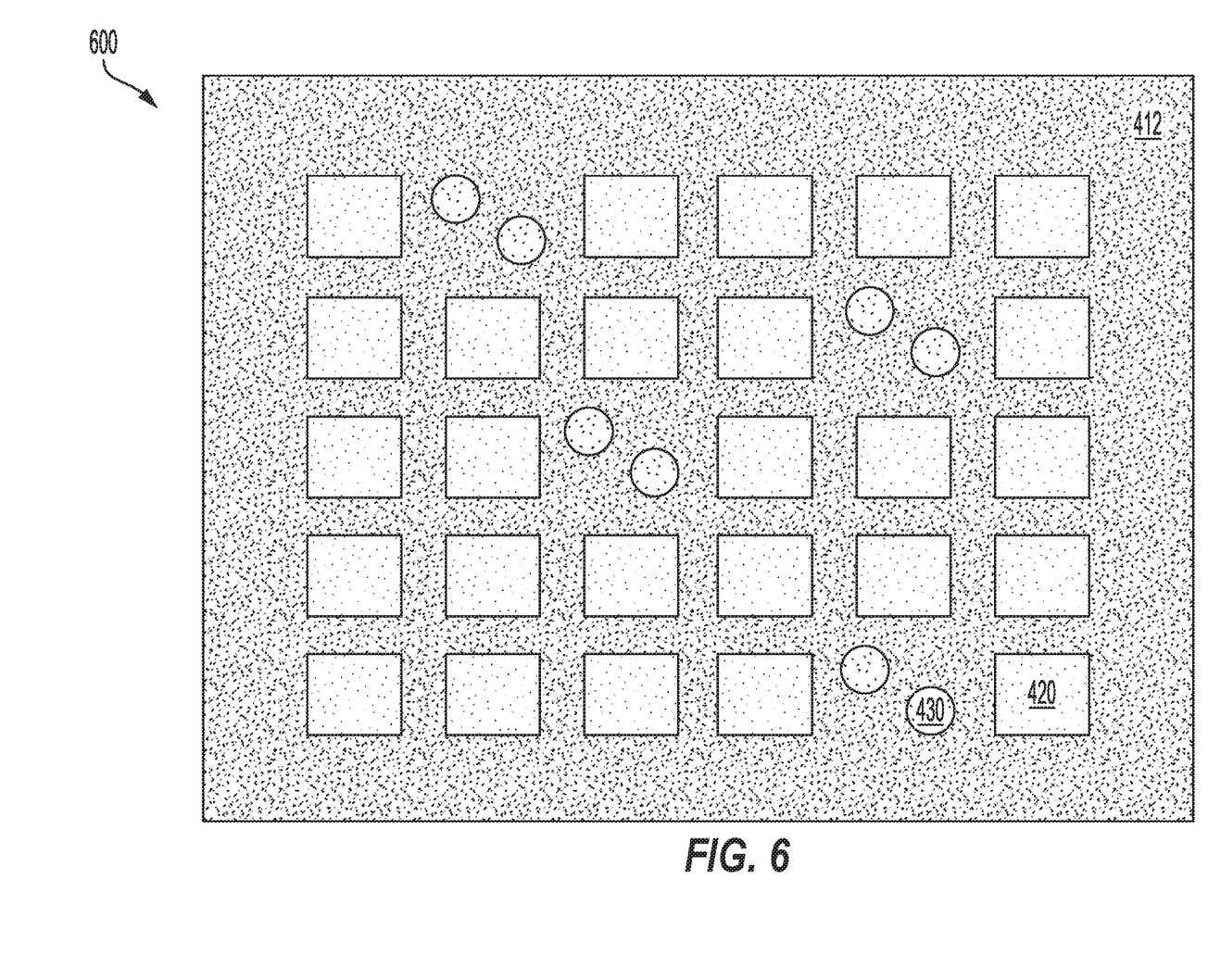
FIG. 6 is a block diagram showing an overhead view, further illustrating the substrate core of the integrated circuit (IC) package of FIGS. 4 and 5, having the passive device orientation for improved passive component density and operation of the IC package, according to aspects of the present disclosure.

FIG. 6 is a block diagram showing an overhead view 600, further illustrating the substrate core 412 of the IC package 400, having the passive device orientation in core for improved passive component density and operation of the IC package 400, according to aspects of the present disclosure. In one configuration, exposed portions of the through substrate vias 430 (430-1 and 430-2) and terminals of the passive devices 420 (420-1 . . . 420-N) are seen through the second surface of the substrate core 412. Relative to conventional placement, vertical placement of the passive devices 420 (420-1 . . . 420-N) enables at least a two-fold density increase of the passive devices 420 (420-1 . . . 420-N). A process for fabricating the IC package 400 of FIG. 4 is shown in FIGS. 7A-7F, according to aspects of the present disclosure.

FIGS. 7A-7F are cross-sectional diagrams illustrating a process for placement of the passive devices 420 (420-1 . . . 420-N) within the substrate core 412 of the IC package 400 of FIGS. 4-6, according to aspects of the present disclosure.

Figure 7A:
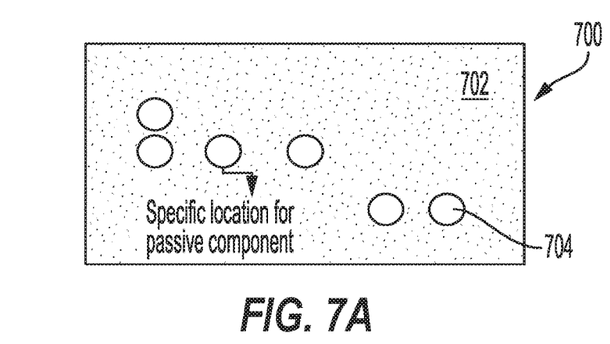
FIGS. 7A-7F are cross-sectional diagrams illustrating a process for placement of the passive devices within the substrate core of the IC package of FIGS. 4-6, according to aspects of the present disclosure.

As shown in FIG. 7A, at step 700, a placement part 702 is shown, including specific locations (e.g., openings 704) for placement of the passive devices 420 (420-1 . . . 420-N), according to an aspect of the present disclosure. In this example, openings 704 within the placement part 702 are formed to improve passive component density by placing the passive devices 420 (420-1 . . . 420-N) in an improved orientation.

Figure 7B:
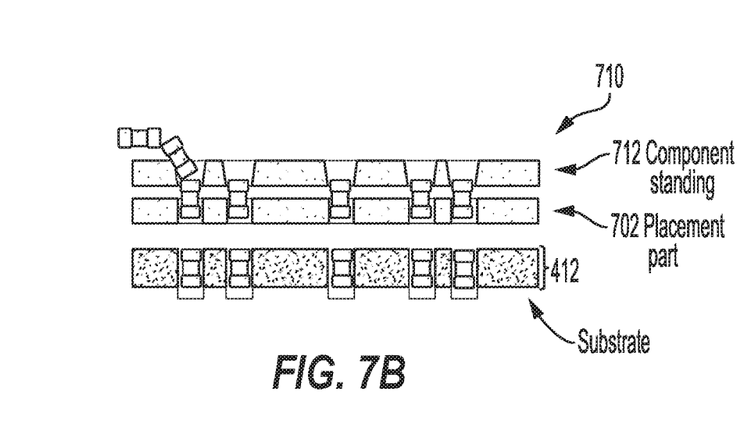
Figure 7C:
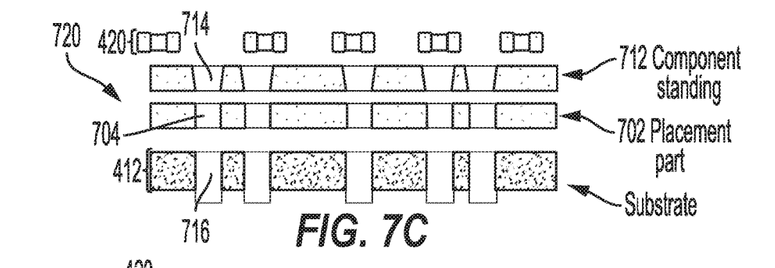

As shown in FIG. 7B, at step 710, a component standing part 712 is aligned with the placement part 702 having the openings 704 aligned with openings 714 in the component standing part 712 and openings 716 in the substrate core 412 as further shown in FIG. 7C, according to aspects of the present disclosure. FIG. 7B shows an overview of a placement process for the passive devices 420 (420-1 . . . 420-N), as further illustrated in FIGS. 7C-7F.

Figures 7D, 7E:
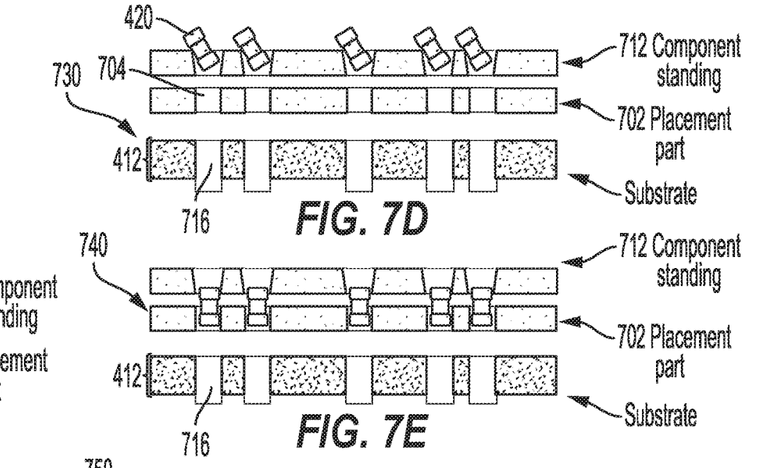

As shown in FIG. 7C, at step 720, the passive devices 420 (420-1 . . . 420-N) are in an initial horizontal position, with the openings (e.g., 714, 704, and 716) aligned in the component standing part 712, the placement part 702, and the substrate core 412, according to aspects of the present disclosure. As shown in FIG. 7D, at step 730, movement (e.g., shaking) of the component standing part 712 causes the passive devices 420 (420-1 . . . 420-N) to enter the openings 714 in the component standing part 712, according to an aspect of the present disclosure.

Figure 7F:
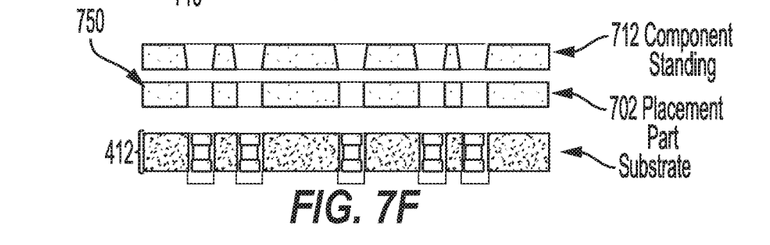

As shown in FIG. 7E, at step 740, the passive devices 420 (420-1 . . . 420-N) transition from the openings 714 in the component standing part 712 to the openings 704 in the placement part 702, according to aspects of the present disclosure. As shown in FIG. 7F, at step 750, the passive devices 420 (420-1 . . . 420-N) transition from the openings 704 in the placement part 702 to the openings 716 in the substrate core 412 in the passive device orientation, according to aspects of the present disclosure. Although not shown in FIG. 7F, a temporary carrier wafer may be bonded to the substrate core 412 to retain the passive devices 420 (420-1 . . . 420-N) within the openings 716 in the substrate core 412.

Figure 8:
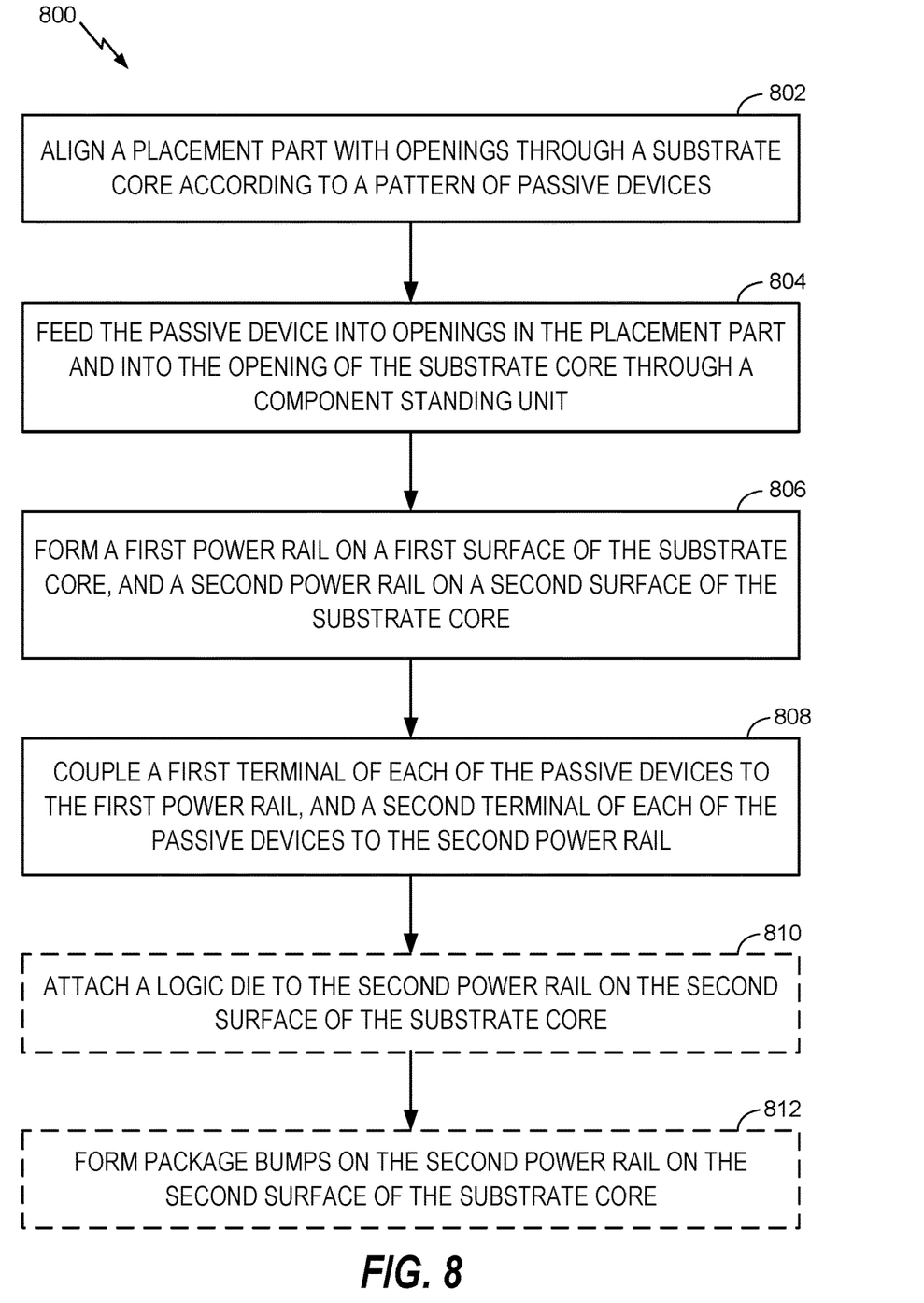
FIG. 8 is a process flow diagram illustrating a method for fabricating an integrated circuit (IC) device package, according to an aspect of the present disclosure.

FIG. 8 is a process flow diagram illustrating a method for fabricating an integrated circuit (IC) device package, according to an aspect of the present disclosure. A method 800 begins in block 802, in which a placement part aligns with openings through a substrate core according to a pattern of passive devices. As shown in FIG. 7C, the openings (e.g., 714, 704, and 716) are aligned in the component standing part 712, the placement part 702, and the substrate core 412. In this example, the passive devices 420 (420-1 . . . 420-N) are in an initial, horizontal position. The passive devices 420 (420-1 . . . 420-N) may be decoupling capacitors, that are rearranged relative to conventional orientation to increase a quantity of the passive devices 420 (420-1 . . . 420-N) within the substrate core 412.

At block 804, the passive device are fed into openings in the placement part and into the opening of the substrate core through a component standing unit. For example, as shown in FIG. 7D, at step 730, movement (e.g., shaking) of the component standing part 712 causes the passive devices 420 (420-1 . . . 420-N) to enter the openings 714 in the component standing part 712. As shown in FIG. 7E, at step 740, the passive devices 420 (420-1 . . . 420-N) transition from the openings 714 in the component standing part 712 to the openings 704 in the placement part 702, according to aspects of the present disclosure. As shown in FIG. 7F, at step 750, the passive devices 420 (420-1 . . . 420-N) transition from the openings 704 in the placement part 702 to the openings 716 in the substrate core 412, according to aspects of the present disclosure.

At block 806, a first power rail is formed on a first surface of the substrate core, and a second power rail is formed on a second surface of the substrate core. For example, as shown in FIG. 5, the first power rail 440 is on the first surface 414, and the second power rail 450 is on the second surface 416 of the substrate core 412. At block 808, a first terminal of each of the passive devices is coupled to the first power rail, and a second terminal of each of the passive devices is coupled to the second power rail. For example, as shown in FIG. 5, the first terminal of each of the passive devices 420 (420-1 . . . 420-N) is directly coupled to the first power rail 440, and the second terminal of each of the passive devices 420 (420-1 . . . 420-N) is directly coupled to the second power rail 450. In this configuration, the passive devices 420 (420-1 . . . 420-N) are placed orthogonal to the first surface 414 and the second surface 416 of the substrate core 412. In addition, the passive devices 420 (420-1 . . . 420-N) are arranged parallel to the through substrate vias 430 (430-1 and 430-2) within the substrate core 412.

At block 810, a logic die is optionally attached to the second power rail on the second surface of the substrate core. For example, as shown in FIG. 4, the logic die 460 is coupled to the second power rail 450 of the package substrate 410 through contact pads 462 opposite from the package bumps 470. At block 812, package bumps are optionally formed on the second power rail on the second surface of the substrate core. For example, as shown in FIG. 4, package bumps 470 are coupled to the first power rail 440 of package substrate 410 of the IC package 400.

According to a further aspect of the present disclosure, an integrated circuit (IC) package is described. In one configuration, the IC package includes a package substrate composed of a substrate core, first means for suppling power on a first surface of the substrate core, and second means for suppling power on a second surface of the substrate core. In one configuration, the first power supplying means and the second powering supplying means may be the first power rail 440 and the second power rail 450, as shown in FIG. 4. In another aspect, the aforementioned means may be any structure or any material configured to perform the functions recited by the aforementioned means.

Figure 9:
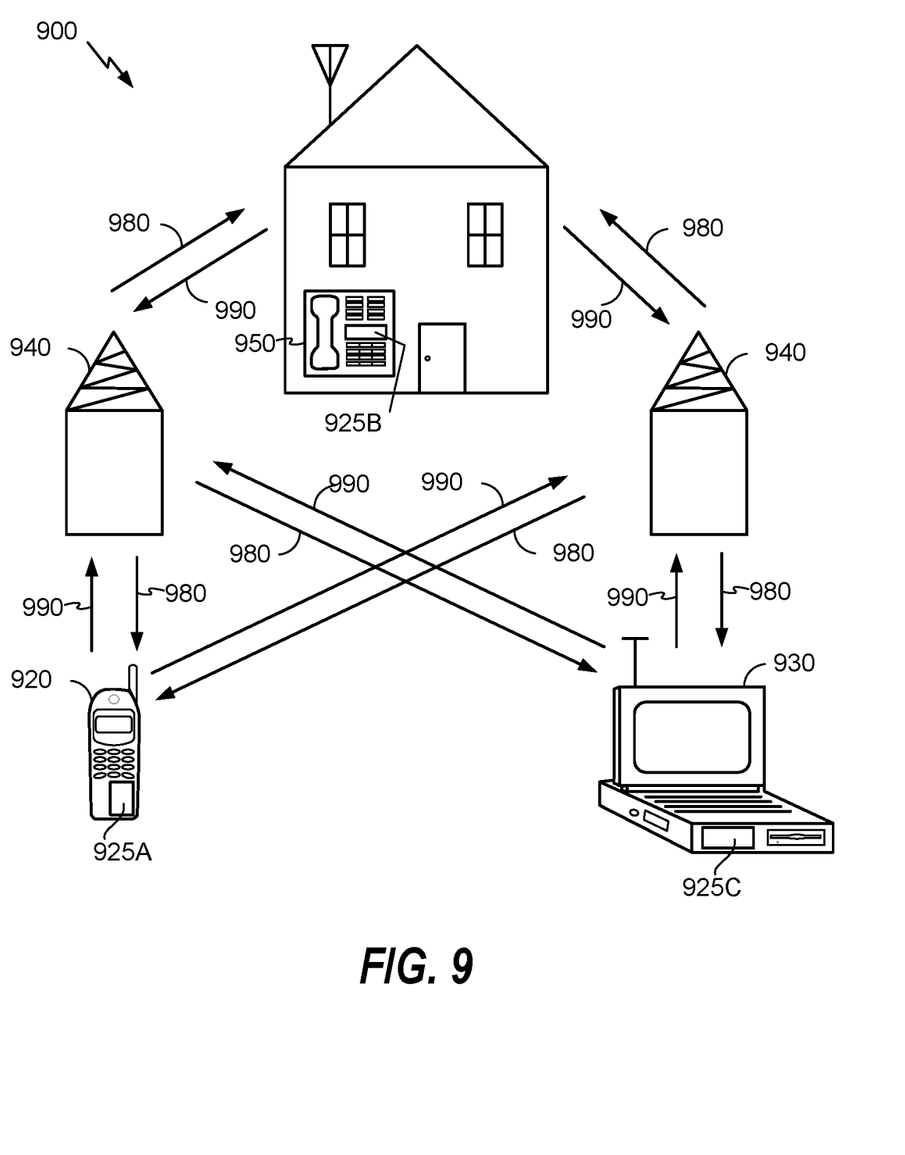
FIG. 9 is a block diagram showing an exemplary wireless communications system in which a configuration of the present disclosure may be advantageously employed.

FIG. 9 is a block diagram showing an exemplary wireless communications system 900 in which an aspect of the present disclosure may be advantageously employed. For purposes of illustration, FIG. 9 shows three remote units 920, 930, and 950, and two base stations 940. It will be recognized that wireless communications systems may have many more remote units and base stations. Remote units 920, 930, and 950 include IC devices 925A, 925B, and 925C that include the disclosed passive device orientation in core for improved power distribution in package. It will be recognized that other devices may also include the disclosed passive device orientation, such as the base stations, switching devices, and network equipment. FIG. 9 shows forward link signals 980 from the base stations 940 to the remote units 920, 930, and 950, and reverse link signals 990 from the remote units 920, 930, and 950 to the base stations 940.

In FIG. 9, remote unit 920 is shown as a mobile telephone, remote unit 930 is shown as a portable computer, and remote unit 950 is shown as a fixed location remote unit in a wireless local loop system. For example, the remote units may be a mobile phone, a hand-held personal communication systems (PCS) unit, a portable data unit, such as a personal data assistant, a GPS enabled device, a navigation device, a set top box, a music player, a video player, an entertainment unit, a fixed location data unit, such as meter reading equipment, or other device that stores or retrieves data or computer instructions, or combinations thereof. Although FIG. 9 illustrates remote units according to the aspects of the present disclosure, the disclosure is not limited to these exemplary illustrated units. Aspects of the present disclosure may be suitably employed in many devices, which include the disclosed passive device orientation.

Figure 10:
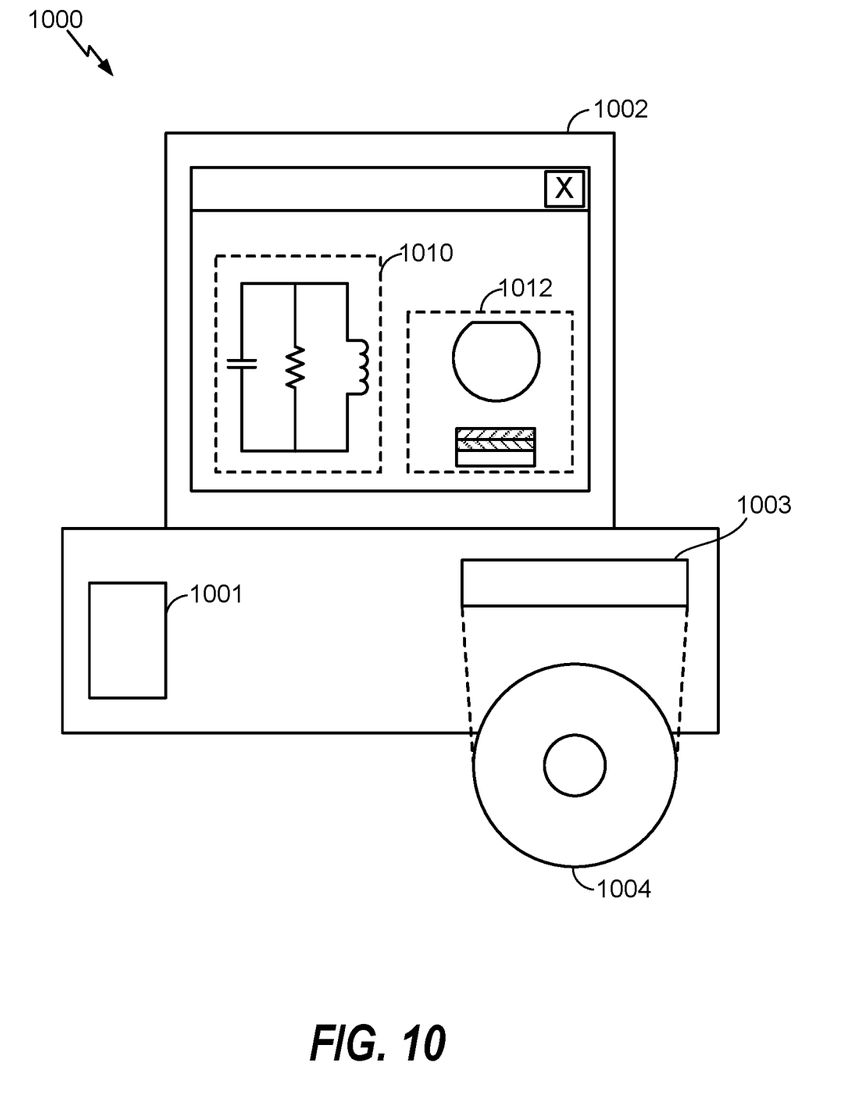
FIG. 10 is a block diagram illustrating a design workstation used for circuit, layout, and logic design of a semiconductor component according to one configuration.

FIG. 10 is a block diagram illustrating a design workstation 1000 used for circuit, layout, and logic design of a semiconductor component, such as the capacitors disclosed above. The design workstation 1000 includes a hard disk 1001 containing operating system software, support files, and design software such as Cadence or OrCAD. The design workstation 1000 also includes a display 1002 to facilitate design of a circuit 1010 or a semiconductor component 1012, such as a passive device orientation in core for improved power distribution in package. A storage medium 1004 is provided for tangibly storing the design of the circuit 1010 or the semiconductor component 1012 (e.g., the passive device orientation). The design of the circuit 1010 or the semiconductor component 1012 may be stored on the storage medium 1004 in a file format such as GDSII or GERBER. The storage medium 1004 may be a CD-ROM, DVD, hard disk, flash memory, or other appropriate device. Furthermore, the design workstation 1000 includes a drive apparatus 1003 for accepting input from or writing output to the storage medium 1004.

Data recorded on the storage medium 1004 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1004 facilitates the design of the circuit 1010 or the semiconductor component 1012 by decreasing the number of processes for designing semiconductor wafers.

For a firmware and/or software implementation, the methodologies may be implemented with modules (e.g., procedures, functions, and so on) that perform the functions described. A machine-readable medium tangibly embodying instructions may be used in implementing the methodologies described. For example, software codes may be stored in a memory and executed by a processor unit. Memory may be implemented within the processor unit or external to the processor unit. As used, the term "memory" refers to types of long term, short term, volatile, nonvolatile, or other memory and is not limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer. Disk and disc, as used herein, include compact disc (CD), laser disc, optical disc, digital versatile disc (DVD), floppy disk, and Blu-ray® disc, where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present disclosure is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosure is provided to enable any person skilled in the art to make or use the disclosure. Various modifications to the disclosure will be readily apparent to those skilled in the art, and the generic principles defined may be applied to other variations without departing from the spirit or scope of the disclosure. Thus, the disclosure is not intended to be limited to the examples and designs described but is to be accorded the widest scope consistent with the principles and novel features disclosed.

What is claimed is:

1. An integrated circuit (IC) package, comprising:
   a package substrate comprising a substrate core, a first power rail on a first surface of the substrate core, and a second power rail on a second surface of the substrate core;
   a logic die supported by the second power rail on the second surface of the substrate core;
   a plurality of passive devices within the substrate core, each having a first terminal and a second terminal opposite the first terminal, in which the first terminal of each of the plurality of the passive devices is directly coupled to the first power rail, and the second terminal of each of the plurality of the passive devices is directly coupled to the second power rail;
   a plurality of conductive through substrate vias (TSVs) extending through the substrate core, each of the plurality of TSVs having a conductive core and alternatively contacted between ground layers and power layers of the first power rail and the second power rail; and
   package bumps on the first power rail on the first surface of the substrate core.

2. The IC package of claim 1, in which the substrate core comprises an embedded passive substrate.

3. The IC package of claim 1, in which the plurality of the passive devices are orthogonal to the first surface and the second surface of the substrate core.

4. The IC package of claim 1, in which the plurality of the passive devices are parallel to the through substrate vias within the substrate core.

5. The IC package of claim 1, in which the first power rail comprises a power rail including the power layers and the second power rail comprises a ground rail including the power layers.

6. The IC package of claim 1, in which the plurality of the passive devices comprise decoupling capacitors.

7. The IC package of claim 6, in which terminals of the decoupling capacitors are alternatively coupled between the ground layers and power layers of the first power rail and the second power rail.

8. The IC package of claim 1, in which the plurality of the passive devices are vertical relative to a width of the substrate core.

9. The IC package of claim 1, in which the package bumps comprise package solder balls coupled to contact pads of a ground rail.

10. An integrated circuit (IC) package, comprising:
    a package substrate comprising a substrate core, first means for supplying power on a first surface of the substrate core, and second means for supplying power on a second surface of the substrate core;
    a logic die supported by the second power supply means on the second surface of the substrate core;
    a plurality of passive devices within the substrate core, each having a first terminal and a second terminal opposite the first terminal, in which the first terminal of each of the plurality of the passive devices is directly coupled to the first power supplying means, and the second terminal of each of the plurality of the passive devices is directly coupled to the second means for supplying power;
    a plurality of conductive through substrate vias (TSVs) extending through the substrate core, each of the plurality of TSVs having a conductive core and alternatively contacted between ground layers and power layers of the first means for supplying power and the second means for supplying power; and
    package bumps on the second power supplying means on the second surface of the substrate core.

11. The IC package of claim 10, in which the substrate core comprises an embedded passive substrate.

12. The IC package of claim 10, in which the plurality of the passive devices are orthogonal to the first surface and the second surface of the substrate core.

13. The IC package of claim 10, in which the plurality of the passive devices are parallel to the through substrate vias within the substrate core.

* * * * *